United States Patent [19]
Bosshart

[11] Patent Number: 6,040,716
[45] Date of Patent: Mar. 21, 2000

[54] DOMINO LOGIC CIRCUITS, SYSTEMS, AND METHODS WITH PRECHARGE CONTROL BASED ON COMPLETION OF EVALUATION BY THE SUBSEQUENT DOMINO LOGIC STAGE

[75] Inventor: Patrick W. Bosshart, Plano, Tex.

[73] Assignee: Texas Instruments Incorporated, Dallas, Tex.

[21] Appl. No.: 09/075,056

[22] Filed: May 8, 1998

Related U.S. Application Data

[60] Provisional application No. 60/047,028, May 19, 1997.

[51] Int. Cl.$^7$ .................... H03K 19/096; H03K 19/094; H03K 19/01
[52] U.S. Cl. ............................... 326/98; 329/93; 329/94; 329/95; 329/96; 329/97; 329/98; 329/17; 329/112; 329/119; 329/121
[58] Field of Search .................. 326/93–98, 17, 326/112, 119, 121

[56] References Cited

U.S. PATENT DOCUMENTS 5,453,708  9/1995  Gupta ........................................ 326/98

FOREIGN PATENT DOCUMENTS 2 267 191  11/1993  United Kingdom .
WO 92 07361  4/1992  WIPO .

*Primary Examiner*—Michael Tokar
*Attorney, Agent, or Firm*—Rebecca Mapstone Lake; Richard L. Donaldson

[57] ABSTRACT

A logic circuit (18) comprising a first phase domino logic circuit (20) and a second phase domino logic circuit (22). Each of the domino logic circuits comprises a precharge node ($20_{PN}$, $22_{PN}$), a coupling device ($20_{PT}$, $22_{PT}$) which when conducting couples the precharge node to a precharge voltage ($V_{DD}$) during a precharge phase, and a discharge path ($20_L$ and $20_{DT}$, $22_L$ and $22_{DT}$) connected to the precharge node which when conducting couples the precharge node to a voltage different than the precharge voltage during an evaluate phase. Further, each of the domino logic circuits comprises an inverter ($20_{IN}$, $22_{IN}$) coupled to the precharge node and providing an output responsive to a voltage at the precharge node. The output of the inverter of the first phase domino logic circuit is connected to control the conduction of the discharge path of the second phase domino logic circuit. The logic circuit further comprises a conductor for providing a clock signal (CLOCK), and circuitry for commencing the evaluate phase of the first phase domino logic circuit at a first time (t1) in response to the clock signal transitioning from a first state to a second state. Still further, the logic circuit comprises circuitry for commencing the evaluate phase of the second phase domino logic circuit at a second time (t2) following the first time, and circuitry (26, 28) for commencing the precharge phase of the first phase domino logic circuit at a third time ($t2_b$) following the second time. The third time corresponds to the latest of a plurality of events. A first of the plurality of events is the clock signal transitioning from the second state to the first state. A second of the plurality of events is the discharge path of the second phase domino logic circuit having sufficient time following a beginning of the evaluate phase of the second domino logic circuit to conduct to cause the voltage at the precharge node of the second phase domino logic circuit to transition to a level sufficient to trigger the output of the inverter of the second phase domino logic circuit.

29 Claims, 4 Drawing Sheets

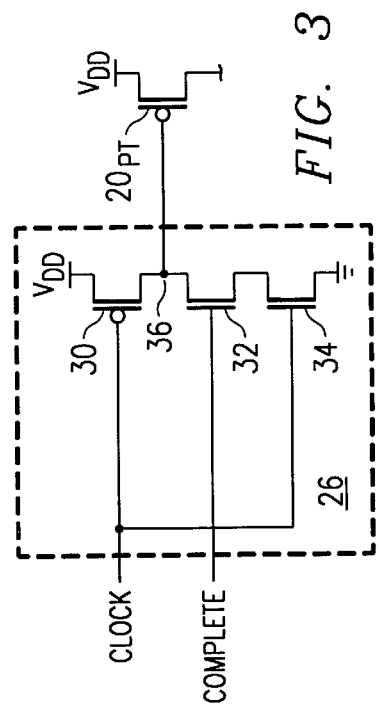
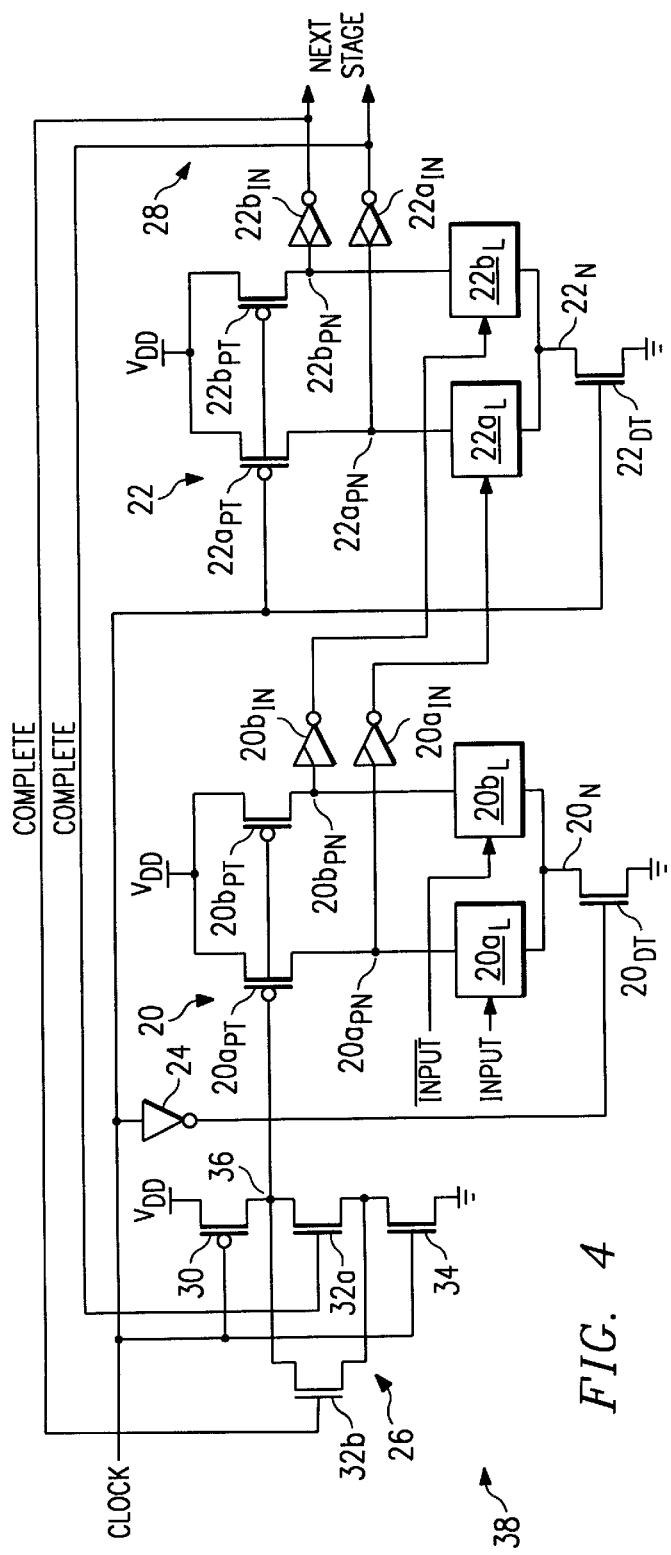
FIG. 3
FIG. 4

DOMINO LOGIC CIRCUITS, SYSTEMS, AND METHODS WITH PRECHARGE CONTROL BASED ON COMPLETION OF EVALUATION BY THE SUBSEQUENT DOMINO LOGIC STAGE

This application claims priority under 35 USC § 119 (e) (1) of provisional application No. 60/047,028 filed May 19, 1997.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to domino logic technology, and are more particularly directed to domino logic circuits, systems, and methods with precharge control based on the completion of evaluation by the subsequent domino logic stage.

In many modern circuit applications, it is often desirable to increase the speed of operation of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time.

To increase the speed of microprocessors, as well as other circuits where speed is important, domino logic transistor circuits are currently used because they often provide increased speed as compared to static logic transistor circuits. A domino logic circuit is characterized by operating in two phases. First, a precharge node is set to a first potential during a precharge phase. Second, during an evaluate phase, if the logic condition represented by the circuit is satisfied, the precharged node is discharged, thereby changing the logic output of the circuit. In other words, at the conclusion of the precharge phase, the precharged node causes a first logic state to be output by the domino logic circuit. Thereafter, if the precharged node is discharged during the evaluate phase, the output of the domino logic circuit represents a second logic state differing from the first logic state. Moreover, the act of discharging to change states, when accomplished using one or more n-channel transistors to gate the transition from precharge to discharge, represents a speed increase over the prior operation of static circuits which in one instance accomplished a transition with a network of n-channel transistors while in another instance accomplished the opposite transition with a network of p-channel transistors.

One specific example of domino logic transistor circuits is known as a hold-time latch. The hold time latch generally follows the principles set forth above as characteristic of domino logic circuits, but as detailed later also takes advantage of a delay in precharging the latch. More specifically, the hold-time latch is connected to output a data signal to a subsequent domino logic stage, where the subsequent domino stage evaluates out of phase with respect to the hold-time latch. Thus, when the hold-time latch completes its evaluate phase, the subsequent stage then performs its evaluate phase based on the data from the hold-time latch. Note, however, that at the same time the subsequent stage begins its evaluate phase, the hold-time latch beings its precharge phase. By design, however, there is a slight delay of time from this point where, even though the control signals have changed to cause the beginning of the precharge phase of the hold-time latch, the output of the hold-time latch from its preceding evaluate phase remains valid. It is during this time, known as the hold time, that the subsequent stage is typically able to trigger (i.e., evaluate) based on the valid data from the hold-time latch. Consequently, data may propagate through this as well as similar connections without the need for complicated additional latching circuitry.

While the above approaches are representative of the art for advancing circuit operational speed, they provide various limitations or drawbacks. For example, the length of the hold-time latch must be long enough to allow the subsequent stage to trigger. Thus, there is effectively a "race" between the hold-time latch and its subsequent stage, whereby the subsequent stage races to trigger based on the data from the hold time while the hold-time latch races to begin its next precharge operation. Note that when this next precharge operation reaches a certain point, it eliminates the valid data and, therefore, ends the hold time. Thus, if the hold-time latch reaches this critical precharge point before the subsequent stage is able to trigger, the circuit fails its purpose and the integrity of the data is lost. The inventor of the present embodiments has recognized these above considerations and below sets forth various embodiments which provide circuit speed while reducing concern over data integrity in domino logic as compared to the current state of the art.

BRIEF SUMMARY OF THE INVENTION

In one embodiment there is a logic circuit comprising a first phase domino logic circuit and a second phase domino logic circuit. Each of the domino logic circuits comprises a precharge node, a coupling device which when conducting couples the precharge node to a precharge voltage during a precharge phase, and a discharge path connected to the precharge node which when conducting couples the precharge node to a voltage different than the precharge voltage during an evaluate phase. Further, each of the domino logic circuits comprises an inverter coupled to the precharge node and providing an output responsive to a voltage at the precharge node. The output of the inverter of the first phase domino logic circuit is connected to control the conduction of the discharge path of the second phase domino logic circuit. The logic circuit further comprises a conductor for providing a clock signal, and circuitry for commencing the evaluate phase of the first phase domino logic circuit at a first time in response to the clock signal transitioning from a first state to a second state. Still further, the logic circuit comprises circuitry for commencing the evaluate phase of the second phase domino logic circuit at a second time following the first time, and circuitry for commencing the precharge phase of the first phase domino logic circuit at a third time following the second time. The third time corresponds to the latest of a plurality of events. A first of the plurality of events is the clock signal transitioning from the second state to the first state. A second of the plurality of events is the discharge path of the second phase domino logic circuit having sufficient time following a beginning of the evaluate phase of the second domino logic circuit to conduct to cause the voltage at the precharge node of the second phase domino logic circuit to transition to a level sufficient to trigger the output of the inverter of the second phase domino logic circuit. Other circuits, systems, and methods are also disclosed and claimed.

BRIEF DESCRIPTION OF THE SEVERAL VIEWS OF THE DRAWING

FIG. 1b illustrates a timing diagram demonstrating the operation of the circuits of FIG. 1a;

FIG. 2b illustrates a timing diagram demonstrating the operation of the circuits of FIG. 2a;

FIG. 3 illustrates an embodiment for implementing the NAND logic function shown in FIG. 2a;

FIG. 4 illustrates a schematic of an alternative inventive embodiment where completion by the successive domino logic circuit of its evaluation is determined by the logical OR of its dual rail outputs;

DETAILED DESCRIPTION OF THE INVENTION

Figure 1A:
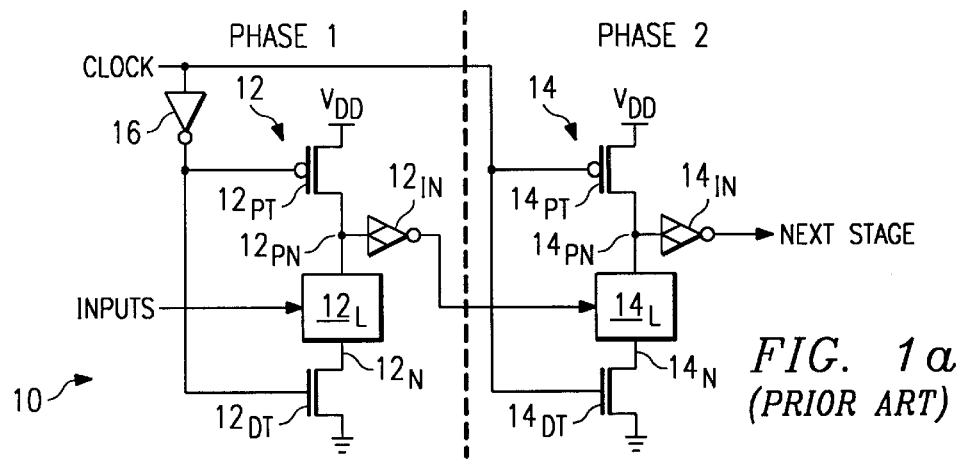
FIG. 1a illustrates a schematic of a prior art domino logic circuit connected as a hold time latch and operating according to a first phase, and outputting a signal forming an input to a successive domino logic circuit operating according to a second phase.

FIG. 1a illustrates a schematic of a prior art domino circuit system designated generally at 10, and which in the art is sometimes referred to as a hold-time latch. System 10 includes circuitry operating in two different phases and, therefore, a vertical dashed line generally separates those phase circuits. Looking to the left of the dashed line, a phase 1 circuit 12 includes a domino logic circuit stage, which includes a precharge transistor $12_{PT}$, a precharge node $12_{PN}$, an output inverter $12_{IN}$, and a discharge path including both a logic circuit $12_L$ and a discharge transistor $12_{DT}$. To the right side of the dashed line of FIG. 1a is a phase 2 circuit 14 which includes a domino logic stage, and which is similarly connected to include a precharge transistor $14_{PT}$, a precharge node $14_{PN}$, an output inverter $14_{IN}$, and a discharge path including both a logic circuit $14_L$ and a discharge transistor $14_{DT}$. Still further, system 10 includes a conductor for providing a CLOCK signal, and the CLOCK signal is connected through an inverter 16 to the gates of precharge transistor $12_{PT}$ and discharge transistor $12_{DT}$, and is connected directly to the gates of precharge transistor $14_{PT}$ and discharge transistor $14_{DT}$. A more detailed discussion of the various connections and interactions of phase circuits 12 and 14 is provided immediately below.

With respect to phase 1 circuit 12, precharge transistor $12_{PT}$ is a p-channel transistor which is typically smaller than the n-channel transistors shown in FIG. 1. Precharge transistor $12_{PT}$ has a source connected to a source of the system voltage level (e.g., $V_{DD}$) and a drain connected to precharge node $12_{PN}$. As noted above, the complement of the CLOCK signal is connected to the gate of precharge transistor $12_{PT}$ and is also connected to the gate of discharge transistor $12_{DT}$. Discharge transistor $12_{DT}$ is an n-channel having its source connected to a low reference voltage (e.g., ground) and its drain connected to a node $12_N$. Between precharge node $12_{PN}$ and node $12_N$ is connected logic circuit $12_L$. The particular logic of logic circuit $12_L$ may implement any type of logic equation. For example, often logic circuit $12_L$ will include numerous transistors connected in various fashions to implement such a logic equation, and the logic function is determined based on the particular transistor configuration as well as the respective input signals connected to the gates of those transistors. For purposes of the present discussion, the particular logic equation and inputs are not important and, thus, the word INPUTS is generally shown with it understood that such signals may come from any of various other circuits, being static, dynamic, or both. What is noteworthy, however, is that once the logic equation formed by logic circuit $12_L$ is true, a conductive path is formed through logic circuit $12_L$ connecting precharge node $12_{PN}$ to node $12_N$. Further, recall that the complement of the CLOCK signal is connected to the gate of discharge transistor $12_{DT}$. Thus, when the CLOCK is low its complement is high and the discharge transistor $12_{DT}$ is also conducting; if this conduction occurs while the logic equation implemented by logic circuit $12_L$ is true, then a discharge path is created from precharge node $12_{PN}$ to ground such that the precharge voltage (i.e., $V_{DD}$) at precharge node $12_{PN}$ is permitted to discharge to ground.

Returning to precharge node $12_{PN}$, it is further connected to the input of output inverter $12_{IN}$. The output of output inverter $12_{IN}$ provides the output signal for circuit 12 (i.e., the result of the logic equation of logic circuit $12_L$). Note that output inverter $12_{IN}$ is shown as having a short diagonal line in both the upper half and lower half of the inverter symbol. For purposes of this document, the upper diagonal line of this symbol is included as a convention to demonstrate that a p-channel transistor (not expressly illustrated) is connected in a feedback manner from the output of the inverter to its input, while the lower diagonal line of this symbol is included as a convention to demonstrate that an n-channel transistor (not expressly illustrated) is connected in a feedback manner from the output of the inverter to its input. With respect to the p-channel feedback transistor, its gate is connected to the output of the corresponding inverter, the source of the feedback p-channel transistor is connected to $V_{DD}$, and the drain of the feedback p-channel transistor is connected to the input of the corresponding inverter. One skilled in the art will therefore appreciate that once the precharge voltage is no longer connected to a given precharge node in FIG. 1 (e.g., during the evaluate phase described below), the feedback p-channel transistor will maintain a high signal at the input of the inverter so long as the precharge node is not discharged by its corresponding discharge path. With respect to the n-channel feedback transistor, it similarly is connected such that its gate is connected to the output of the inverter, its source is connected to ground, and its drain connected to the input of the inverter. One skilled in the art will therefore appreciate that if an input signal first enables logic circuit $12_L$ to conduct but then that signal is no longer enabling during the evaluate phase, the feedback n-channel transistor will maintain a low signal at the input of the inverter until the precharge node is once again precharged by enabling precharge transistor $12_{PT}$.

With respect to phase 2 circuit 14, note that its circuit elements are generally connected in the same manner as phase 1 circuit 12 detailed above, with the exception of the inputs to its logic circuit $14_L$ as well as the output of phase 2 circuit 14. Thus, the inputs and outputs are discussed below while the remainder of the circuit details are not re-stated here and the reader is referred to the above discussion of phase 1 circuit 12 for comparable details.

Turning to the input of phase 2 circuit 14, note that at least one of the inputs to its logic circuit $14_L$ is provided by the output of phase 1 circuit 12 and, therefore, a connection is shown from output inverter $12_{IN}$ to logic circuit $14_L$. Logic circuit $14_L$, like logic circuit $12_L$, also realizes a logic equation. Again, the particular equation realized is not critical, but for reasons set forth below it should be noted that at least one of the inputs to perform the equation of logic circuit $14_L$ requires an input signal which is output from phase 1 circuit 12. Thus, note that logic circuit $14_L$ will properly evaluate its logic equation only if a valid output is provided by inverter $12_{IN}$ to logic circuit $14_L$.

Turning to the output of phase 2 circuit 14, it is shown to merely pass on to a next stage (not shown). This illustration is shown in this manner by way of example and, therefore, the connectivity to the output is not critical to an understanding of the present introductory discussion. Thus, the output could connect to various different circuits, such as: (1) a circuit operating according to the same phase as phase 2 circuit 14; (2) a circuit operating according to the same phase as phase 1 circuit 12; (3) a circuit operating according to a phase different than both phase 1 and phase 2 circuits 12 and 14, respectively; or (4) a static circuit as opposed to a phase controlled circuit.

Figure 1B:
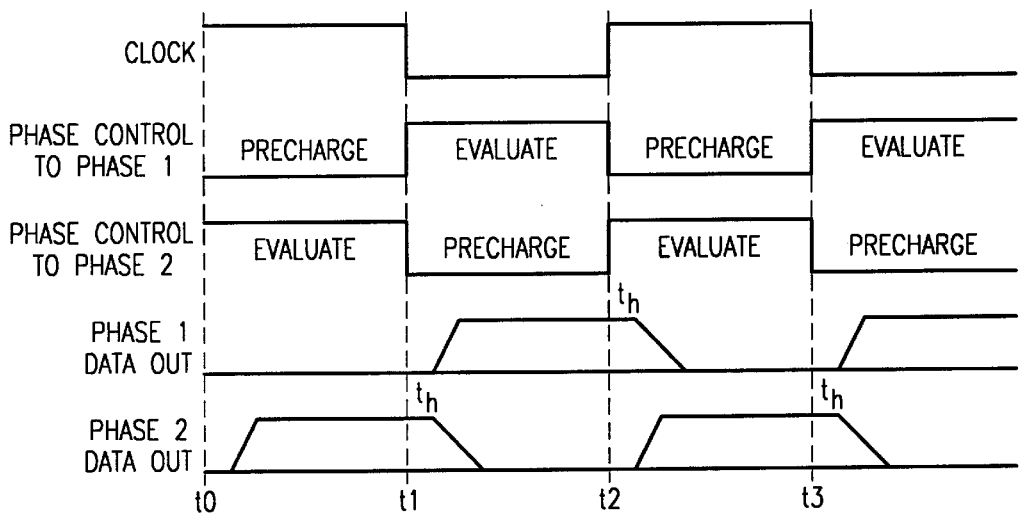

The operation of system 10 is understood with reference to the prior art timing diagram of FIG. 1b. Before studying that Figure, however, note that system 10 does not include separate complex latch structures between the output of phase 1 circuit 12 and the input to phase 2 circuit 14; the ability for system 10 to operate despite this lack of additional structure is now explained in connection with FIG. 1b. Turning then to FIG. 1b, first is presented an introduction to its signal rows which are discussed from top to bottom, and then following is a detailed analysis of the operation depicted by those signals. The first (i.e., top) row of FIG. 1b merely shows the state of the CLOCK signal, while its second and third rows show the phase control signals as applied to phase 1 circuit 12 and phase 2 circuit 14, respectively. The fourth and fifth rows of FIG. 1b depict the data values output by phase 1 circuit 12 and phase 2 circuit 14, respectively.

Looking to the specific signals of FIG. 1b, assume by a time to that system 10 is running at a steady-state. Between t0 and t1, the CLOCK signal is high. As a result of the high CLOCK signal, phase 1 circuit 12 is in a precharge phase of operation. More specifically with respect to phase 1 circuit 12, note that the high CLOCK signal is inverted and applied to the gates of p-channel precharge transistor $12_{PT}$ and n-channel discharge transistor $12_{DT}$. Because of the conductivity types of these transistors, precharge transistor $12_{PT}$ is conducting while discharge transistor $12_{DT}$ is not. The conduction of precharge transistor $12_{PT}$ causes precharge node $12_{PN}$ to rise to $V_{DD}$ and this signal is inverted by output inverter $12_{IN}$, thereby causing the output of phase 1 circuit 12 (i.e., fourth row of FIG. 1b) to be low between t0 and t1. Note further that, in response to the high CLOCK signal between t0 and t1, phase 2 circuit 14 is in an evaluate phase of operation. More specifically, the high CLOCK signal is connected directly to the gates of p-channel precharge transistor $14_{PT}$ and n-channel discharge transistor $14_{DT}$. Because of the conductivity types of these transistors, precharge transistor $14_{PT}$ is not conducting while discharge transistor $14_{DT}$ is conducting. The conduction of discharge transistor $14_{DT}$ places phase 2 circuit 14 in its evaluate phase and, if the logic equation realized by logic circuit $14_L$ is true, then the previous precharged voltage at precharge node $14_{PN}$ will discharge to ground. In this case, the voltage at precharge node $14_{PN}$ is inverted by output inverter $14_{IN}$, thereby causing the output of phase 2 circuit 14 (i.e., fifth row of FIG. 1b) to rise between t0 and t1.

At t1, the clock signal to both phase circuits 12 and 14 transitions to an opposite level. Thus, at t1, phase 2 circuit 14 has finished its evaluate phase of operation and, therefore, valid data exists at the output of inverter $14_{IN}$. Immediately after t1, however, the signal at the gate of p-channel precharge transistor $14_{PT}$ transitions from high to low. Note, therefore, that p-channel precharge transistor $14_{PT}$ begins to conduct and the voltage at precharge node $14_{PN}$ begins to rise (assuming it was discharged in the immediately preceding evaluate phase). However, due to the delay in response time of the p-channel precharge transistor $14_{PT}$, some amount of time passes before precharge node $14_{PN}$ precharges from low to a full high level. As a result, a corresponding amount of time after t1, and indicated as $t_h$ on FIG. 1b, passes before the output of phase 2 circuit 14 (i.e., the output of inverter $14_{IN}$) transitions from high to low due to the precharge effect. In other words, the data output by phase 2 circuit 14 is held (i.e. remains valid) for some short period or "hold time," denoted as $t_h$, even though the clock signal connected to that circuit has now switched to cause its stage(s) to change from the evaluate phase of operation to the precharge phase of operation.

In addition to the holding of data by phase 2 circuit 14 as described above, note further after t1 that phase 1 circuit 12 is in its evaluate phase of operation (e.g., its discharge transistor $12_{DT}$ is conducting due to the transition of the CLOCK signal). Thus, phase 1 circuit 12 makes its evaluation based on the inputs it receives and, if its discharge path discharges its precharge node $12_{PN}$, then its output rises shortly after t1 as shown in the fourth row of FIG. 1b.

With the operation of phase 2 circuit 14 described above with respect to its hold time, the operation of phase 1 circuit 12 as a hold time latch is apparent after t2 and with respect to the data it provides to phase 2 circuit 14. Specifically, at t2, the clock signal again transitions. In response, the phase control to phase 1 circuit 12 causes circuit 12 to precharge while the phase control to phase 2 circuit 14 causes circuit 14 to evaluate. With respect to phase 1 circuit 12, however, note again that some time is required after t2 before its p-channel precharge transistor $12_{PT}$ pulls its precharge node $12_{PN}$ to $V_{DD}$. During this time, therefore, the data output from phase 1 circuit 12 temporarily remains valid and, again, this time is shown as a hold time, $t_h$, after t2 in FIG. 1b. Also during this hold time, recall that phase 2 circuit 14 has now been switched to perform its evaluate phase. Thus, provided that the $t_h$ of phase 1 circuit 12 is sufficiently long after t2, phase 2 circuit 14 may perform its evaluation based on its inputs, which include the temporarily valid data output by phase 1 circuit 12. Again, therefore, phase 2 circuit 14 evaluates and, if its logic equation is true, its precharge node $14_{PN}$ is discharged, thereby generating a rising output some time shortly after t2 as shown in the bottom row of FIG. 1b. Consequently, note now that the successive connection of the output from phase 1 circuit 12 to the input of phase 2 circuit 14 permits an evaluation by phase 2 circuit 14 based on data from the preceding circuit 12, but without the requirement of additional latches. Still further, one skilled in the art will appreciate from the remainder of FIG. 1b that this concept continues to apply as data continues in the fashion between the two phase circuits of FIG. 1a. Moreover, this same aspect would further apply if system 10 included additional successive circuits clocked to precharge at different times, or if each phase circuit included more than one domino logic stage connected to the clock of that phase circuit. Additionally, note that FIG. 1a is simplified to show only two successive circuits; in actuality, when not simplified, one or more of the circuits within FIG. 1a are typically a portion of a larger circuit which may be mixed with latched inputs to one or more of the phase circuits.

Given the above, the structures of FIG. 1a and described in connection with the timing diagram of FIG. 1b demonstrate that complicated latches are not necessarily required when connecting successive phases of domino logic circuitry. However, the present inventor has recognized that this prior art approach has certain limitations. As one key example, note that for proper operation of system 10, the duration of $t_h$ must be sufficient to permit a subsequent stage to properly trigger based on the data output during $t_h$. For example, when phase 1 circuit 12 outputs its valid data during $t_h$ and after t2, recall that phase 2 circuit 14 then evaluates based on that data. However, if $t_h$ were shorter in duration, that is, if precharge node $12_{PN}$ precharged at a faster rate, then it may be possible that the data output by output inverter $12_{IN}$ would be overwritten by the precharge voltage before phase 2 circuit 14 had an opportunity to evaluate. Thus, there is the constant "race" as briefly discussed in the above Background, where a stage following a hold time latch must evaluate before the hold time latch precharges. As detailed below, however, the present embodiments eliminate this problem and provide additional benefits as well.

Figure 2A:
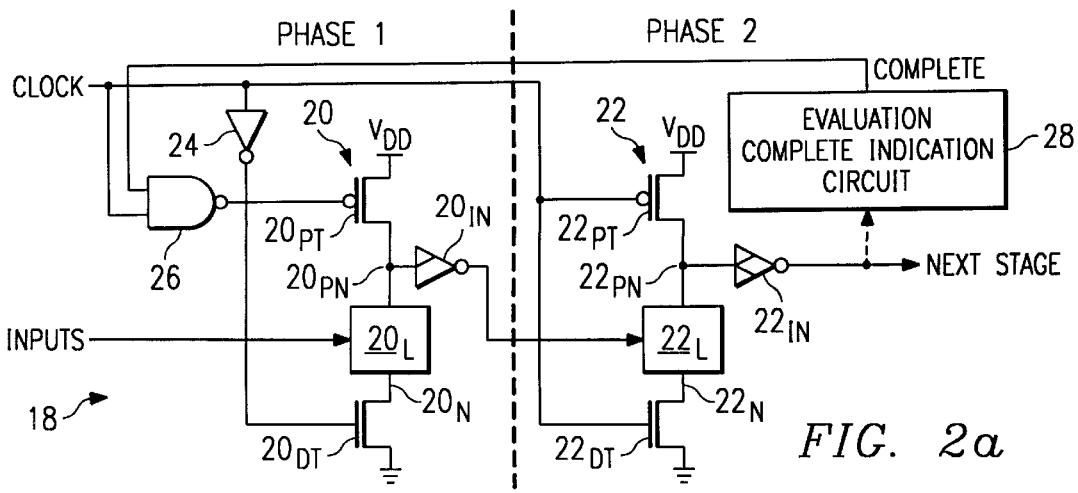
FIG. 2a illustrates a schematic of a first inventive embodiment including a domino logic circuit connected as a hold time latch and operating according to a first phase, and outputting a signal forming an input to a successive domino logic circuit operating according to a second phase, where the precharge phase of operation of the hold time latch is controlled in part in response to the evaluation by the successive domino logic circuit.

FIG. 2a illustrates a schematic of a first inventive domino circuit system designated generally at 18. System 18 in certain respects resembles system 10 of FIG. 1, above, yet to prevent confusion during the subsequent discussion different reference numerals are used in FIG. 2a. Nevertheless, the reader is assumed to be familiar with the prior discussion so that the details of various concepts are not re-stated below. Looking to system 18, it includes circuitry operating in different phases and again, therefore, a vertical dashed line generally separates those phase circuits. Looking to the left of the dashed line, a phase 1 circuit 20 includes a domino logic circuit stage, which includes a precharge transistor $20_{PT}$, a precharge node $20_{PN}$, an output inverter $20_{IN}$, and a discharge path including both a logic circuit $20_L$ and a discharge transistor $20_{DT}$. To the right side of the dashed line of FIG. 2a is a phase 2 circuit 22 which includes a domino logic stage, and which is similarly connected to include a precharge transistor $22_{PT}$, a precharge node $22_{PN}$, an output inverter $22_{IN}$, and a discharge path including both a logic circuit $22_L$ and a discharge transistor $22_{DT}$.

System 10 also includes a conductor for providing a CLOCK signal. Note here that the CLOCK signal is connected in a different manner than as in the prior art system 10 shown in FIG. 1a, above. Specifically, with respect to phase 1 circuit 20, the CLOCK signal is again connected through an inverter 24 to the gate of n-channel discharge transistor $20_{DT}$, but this complementary signal is not directly connected to the gate of p-channel precharge transistor $20_{PT}$. Instead, the CLOCK signal is connected to a first input of a logic NAND circuit 26, and the output of logic NAND circuit 26 is connected to the gate of p-channel precharge transistor $20_{PT}$. The second input of logic NAND circuit 26 is discussed later. With respect to phase 2 circuit 22, the CLOCK signal is connected directly to the gates of p-channel precharge transistor $22_{PT}$ and n-channel discharge transistor $22_{DT}$.

A more detailed description of the connections within phase 1 logic circuit 20 is as follows. Precharge transistor $20_{PT}$ has a source connected to a source of the system voltage level (e.g., $V_{DD}$) and a drain connected to precharge node $20_{PN}$. Again, the output of the logic NAND circuit 26 is connected to the gate of precharge transistor $20_{PT}$. As noted above, the complement of the CLOCK signal is connected to the gate of discharge transistor $20_{DT}$, which note is an n-channel having its source connected to a low reference voltage (e.g., ground) and its drain connected to a node $20_N$. Between precharge node $20_{PN}$ and node $20_N$ is connected logic circuit $20_L$. Again, the particular logic of logic circuit $20_L$ may implement any type of logic equation, with the equation ultimately determined based on the transistor configuration implementing the logic equation. The inputs to these transistors are generally shown as "INPUTS" in FIG. 2a, with it understood that such signals may come from various circuits, being static, dynamic, or both. Also, once the logic equation formed by logic circuit $20_L$ is true, a conductive path is formed through logic circuit $20_L$ connecting precharge node $20_{PN}$ to node $20_N$. Further, recall that the complement of the CLOCK signal is connected to the gate of discharge transistor $20_{DT}$. Thus, when the CLOCK is low its complement is high and discharge transistor $20_{DT}$ is also conducting; if this conduction occurs while the logic equation implemented by logic circuit $20_L$ is true, then a discharge path is created from precharge node $20_{PN}$ to ground such that the precharge voltage (i.e., $V_{DD}$) at precharge node $20_{PN}$ is permitted to discharge to ground.

The output of phase 1 circuit 20 is connected as an input to phase 2 circuit 22. More particularly, precharge node $20_{PN}$ is connected to the input of an output inverter $20_{IN}$. Output inverter $20_{IN}$ has a short diagonal line in the upper half of the inverter symbol. For purposes of this document, this symbol is included as a convention to demonstrate that a p-channel transistor (not expressly illustrated) is connected in a feedback manner from the output of the inverter to its input. More particularly, the gate of the feedback p-channel transistor is connected to the output of the corresponding inverter, the source of the feedback p-channel transistor is connected to $V_{DD}$, and the drain of the feedback p-channel transistor is connected to the input of the corresponding inverter. The output of output inverter $20_{IN}$ is connected as an input to the logic circuit $22_L$ of phase 2 circuit 22, which is described in greater detail immediately below.

The remaining connections of phase 2 logic circuit 22 are as follows. Precharge transistor $22_{PT}$ has a source connected to a source of the system voltage level (e.g., $V_{DD}$), a drain connected to precharge node $22_{PN}$, and a gate connected directly to the CLOCK signal. The CLOCK signal is also connected to the gate of discharge transistor $22_{DT}$, which is an n-channel having its source connected to a low reference voltage (e.g., ground) and its drain connected to a node $22_N$. Between precharge node $22_{PN}$ and node $22_N$ is connected logic circuit $22_L$. Again, the particular logic of logic circuit $22_L$ may implement any type of logic equation, with the equation determined by the transistor configuration implementing the logic equation. As mentioned above, one of these inputs is provided by the output of phase 1 circuit 20. However, additional inputs also may be received from other circuits as well. In any event, once the logic equation formed by logic circuit $22_L$ is true, a conductive path is formed through logic circuit $22_L$ connecting precharge node $22_{PN}$ to node $22_N$. Further, recall that the CLOCK signal is connected to the gate of discharge transistor $22_{DT}$. Thus, when the CLOCK is high then discharge transistor $22_{DT}$ is also conducting, and if this conduction occurs while the logic equation implemented by logic circuit $22_L$ is true, then a discharge path is created from precharge node $22_{PN}$ to ground such that the precharge voltage (i.e., $V_{DD}$) at precharge node $22_{PN}$ is permitted to discharge to ground. Lastly, note that precharge node $22_{PN}$ is connected to the input of an output inverter $22_{IN}$. Output inverter $22_{IN}$ is shown with a diagonal line in both its upper and lower half and, therefore, consistent with the above convention, includes both an n-channel and p-channel feedback transistor configured in the manner described above. Lastly, note that the output of phase 2 circuit 22 is shown to merely pass on to a next stage (not shown) and this illustration is shown in this manner only by way of example. Therefore, the connectivity to the output is not critical to an understanding of the present embodiments, and the output could connect to various different dynamic or static circuits, where the former are either in phase or out of phase with respect to phase 2 circuit 22.

In addition to the above, another aspect of FIG. 2a is its inclusion of an evaluation complete indication circuit designated at 28 and shown by the output of phase 2 circuit 22. For reasons more clear below, evaluation complete indication circuit 28 is shown associated with the output of phase 2 circuit 22 by way of a dashed arrow from the output of phase 2 circuit 22 to evaluation complete indication circuit 28. This dashed representation is used because in some embodiments there is a direct connection between these two elements whereas in alternative embodiments there may not be such a connection, both of which are detailed below. As a general introduction, note that evaluation complete indication circuit 28 is included to indicate when phase 2 circuit 22 has completed its evaluation based on the input from phase 1 circuit 20. Particularly, as a domino logic circuit, it is known that phase 2 circuit 22 will precharge and then commence an evaluate phase to determine if the logic equation implemented by its logic circuit $22_L$ is true. The length of the entire evaluate phase is determined by when phase 2 circuit 22 next begins to precharge. However, the actual logic equation determination is made after the beginning of the evaluate phase, but certainly before its conclusion. Thereafter, if the logic equation is true, precharge node $22_{PN}$ will begin to discharge. Eventually, therefore, precharge node $22_{PN}$ will reach a sufficiently low voltage so as to trigger output inverter $22_{IN}$. This triggering of output inverter $22_{IN}$ represents the completion of the evaluation (but not necessarily the evaluate phase which may continue if the CLOCK remains high). Given this sequence, in the preferred embodiment evaluation complete indication circuit 28 represents a function, shown as a COMPLETE signal on FIG. 2a, indicating completion of the evaluation.

Having introduced the functionality of evaluation complete indication circuit 28, and returning to the dashed arrow, recall it is dashed rather than solid to depict either a direct connection or an indirect association. In the case of a direct connection, a COMPLETE signal may be directly in response to the output of inverter $22_{IN}$, in which case evaluation complete indication circuit 28 is actually connected to the output of output inverter $22_{IN}$ to detect the triggering of output inverter $22_{IN}$ and to provide the COMPLETE signal. In the case of an indirect association, the COMPLETE signal may be a prediction of when the output of inverter $22_{IN}$ has had sufficient time to be triggered after the commencement of the evaluate phase, in which case evaluation complete indication circuit 28 is not necessarily connected to the output of output inverter $22_{IN}$ but nevertheless is able to model the behavior of its output in order to provide the COMPLETE signal. Regardless of the manner in which the COMPLETE signal is generated, note that it is connected as the second input to logic NAND circuit 26. Thus, note that the output of logic NAND circuit 26 remains high until the later of two events: (1) the transition of the CLOCK signal from low to high; and (2) the assertion of the COMPLETE signal. Since the output of logic NAND circuit 26 is connected to the gate of p-channel precharge transistor $20_{PT}$, then one skilled in the art will therefore appreciate that phase 1 circuit 20 will not precharge until these two events have occurred, as further demonstrated below.

Before proceeding, note that the circuits within FIG. 2a illustrate only two circuits along a given path. In actuality, however, it is quite possible for a path to include more than two circuits. Additionally, it is also common that each circuit may be part of an overall network of circuits having multiple inputs and multiple outputs. In such a network, a first path may be formed through that network during a given time period where that first path includes various circuits, while a different path may be formed through that network during a different time period where that different path includes different circuits, which may or may not include the same circuits as the first path through the network. Lastly, note also that networking of circuits in this manner is well known in the art.

Figure 2B:
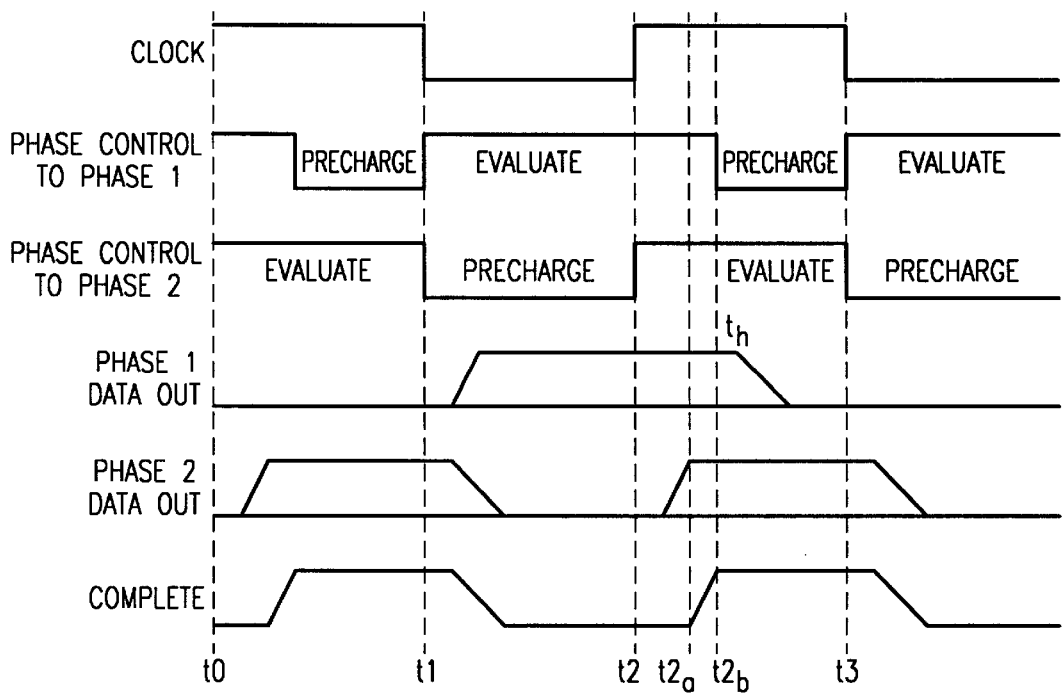

The operation of system 18 is understood with reference to the timing diagram of FIG. 2b. As an introduction to each of its rows from top to bottom of the Figure, the first row depicts the CLOCK signal which recall is connected directly to control the phase operation of phase 2 circuit 22. Thus, the third row, which shows the phase control of phase 2 circuit 22, merely tracks the same signal as the first row. The second row of FIG. 2b depicts the phase control of phase 1 circuit 20. Recall that the commencement of the precharge phase of phase 1 circuit 20 is not directly controlled by the CLOCK but, instead, is controlled by the output of logic NAND circuit 26; thus, the second row of FIG. 1b does not merely track the complement of the CLOCK signal as it did in FIG. 1b. This contrast is better appreciated from the discussion below. Before reaching that discussion, considering the remaining rows of FIG. 2b, its fourth and fifth rows depict the data output of phase 1 and 2 circuits 20 and 22, respectively. Finally, the bottom row of FIG. 2b illustrates the COMPLETE signal output of evaluation complete indication circuit 28 which, as introduced above, is asserted at a time when the voltage at precharge node $22_{PN}$ of phase 2 circuit 22 has had sufficient time to discharge and trigger output inverter $22_N$.

Looking to the specific signals of FIG. 2b, assume by a time t0 that system 18 is running at a steady-state. The signal transitions immediately after t0 need not be detailed at this point but will be appreciated as comparable to the repeated instances of those same transitions occurring after t2. Thus, looking generally from the middle of t0 forward, note that phase 1 circuit 20 is in its precharge phase of operation while phase 2 circuit 22 is in its evaluate phase of operation. Regarding the latter, therefore, phase 2 circuit 22 is outputting data from its evaluation. By definition, therefore, the evaluation is complete and so the COMPLETE signal is asserted in the last row of FIG. 2*b*.

At t1, the CLOCK signal transitions from high to low, thereby applying a high signal to discharge transistor 20$_{DT}$ of phase 1 circuit 20 and a low signal to precharge transistor 22$_{PT}$ and discharge transistor 22$_{DT}$ of phase 2 circuit 22. As a result, the second and third rows of FIG. 2*b* illustrate an evaluate and precharge control signal to the respective phase circuits. Note that phase 1 circuit 20 evaluates in response to this transition in the CLOCK and, therefore, after a short delay following t1 phase 1 circuit 20 outputs valid data as shown in the fourth row of FIG. 2*b*. Note also that phase 2 circuit 22 precharges in response to this transition of the CLOCK and, therefore, after a short delay following t1 the output of phase 2 circuit 20 falls to zero as shown in the fifth row of FIG. 2*b*.

At t2, the CLOCK signal transitions from low to high. Because this transition is connected differently to each of phase 1 circuit 20 and phase 2 circuit 22, it does not have merely a complementary effect on each circuit as in the prior art. Thus, the different effect of this clock transition on each of the different phase circuits is addressed below.

With respect to phase 2 circuit 22, recall that the CLOCK is connected directly to the gate of discharge transistor 22$_{DT}$. More specifically, therefore, the transition of the CLOCK signal from low to high causes precharge transistor 22$_{PT}$ to stop conducting, and causes discharge transistor 22$_{DT}$ to begin conducting. Therefore, phase 2 circuit 22 is free to evaluate should a conductive path be formed through logic circuit 22$_L$ due to its input(s). Thus, at t2 phase 2 circuit 22 begins its evaluate phase of operation as shown in the third row of FIG. 2*b*.

With respect to phase 1 circuit 20, recall that the complement of the CLOCK signal is not connected directly to the gate of precharge transistor 22$_{PT}$ as in the prior art. Instead, the CLOCK signal is connected as an input to logic NAND circuit 26. Thus, the transition of the CLOCK signal from low to high at t2 does not by itself begin the precharge phase of operation for phase 1 circuit 20. However, note further that the CLOCK signal is complemented and connected to the gate of discharge transistor 20$_{DT}$ as in the prior art. Thus, the following results are present just after t2. First, discharge transistor 20$_{DT}$ is no longer conducting because of the CLOCK transition and, thus, the evaluate phase of operation for phase 1 circuit 20 is concluded. However, note that just after t2 the COMPLETE signal is not asserted because phase 2 circuit 22 has just commenced its evaluate phase and, therefore, has not had a sufficient time to trigger its output inverter 22$_{IN}$ (if it will at all during the current evaluate phase). Thus, precharge transistor 20$_{PT}$ is also not conducting just after t2. Consequently, after the clock transition of t2, phase 1 circuit 20 is effectively in neither its evaluate phase of operation nor its precharge phase of operation.

At a time t2$_a$ following t2, phase 2 circuit 22 will complete its evaluation, that is, if it is to trigger output inverter 22$_{IN}$ because its logic equation is found true, then this action will have occurred by t2$_a$. Therefore, at t2$_a$, evaluation complete indication circuit 28 asserts the COMPLETE signal as shown in the bottom row of FIG. 2*b*. Recall that the COMPLETE signal is connected as an input to logic NAND circuit 26, and that this same NAND circuit has already received a high signal at its other input at t2 when the CLOCK rose from low to high. Thus, after the delay of logic NAND circuit 26, at t2$_b$ the output of logic NAND circuit 26 falls from high to low, thereby providing a precharge control to p-channel precharge transistor 20$_{PT}$ as shown in the second row of FIG. 2*b* at time t2$_b$. In response, precharge transistor 20$_{PT}$ begins to conduct and, after a short hold time t$_h$, pulls down precharge node 20$_{PN}$ which is further inverted and output by inverter 20$_{IN}$ as shown in the fourth row of FIG. 2*b* following time t2$_b$.

Given the above, note various observations about the operation of system 18 as shown by FIG. 2*b*. The above operation demonstrates that phase 1 circuit 20 will not precharge until the later of the following two events: (1) the rising edge of the CLOCK signal; and (2) assertion of the COMPETE signal. Thus, one skilled in the art will appreciate that if the precharge is postponed in this manner, then phase 1 circuit 20 will always maintain its valid output long enough so that phase 2 circuit 22 may perform its evaluation before the valid output from phase 1 circuit 20 is overwritten by a subsequent precharge. Thus, the race between successive stages as described in connection with FIG. 1 is eliminated. As a result, the present embodiments provide improved performance over the prior art in that there is no opportunity for failure of the circuit where a first stage precharges before its successive stage has an opportunity to evaluate. In addition to these benefits, note further that the present embodiments may be implemented in various fashions and may apply to still additional contexts as well, both concepts of which are further detailed below.

Given the above, one skilled in the art will appreciate that NAND circuit 26 delays the precharging of phase 1 circuit 20 until the later of two signals reaching its inputs, where those two signals are the assertion of the COMPLETE signal or a transition from the CLOCK signal from low to high. Before proceeding, however, note that while FIG. 2*b* illustrates the instance where the COMPLETE signal is asserted after the CLOCK transitions from low to high, under the present embodiments the precharge phase of phase 1 circuit 20 or a comparable domino logic stage is also postponed if these two events are reversed in time, that is, if the COMPLETE signal is asserted and thereafter a transition of the CLOCK from low to high reaches NAND circuit 26. It is for this reason that it is stated above that it is the later of these two events which triggers the precharge phase of phase 1 circuit 20, and an example of where these events may occur in reverse order is shown and described in connection with FIG. 2*c*, below.

Figure 2C:
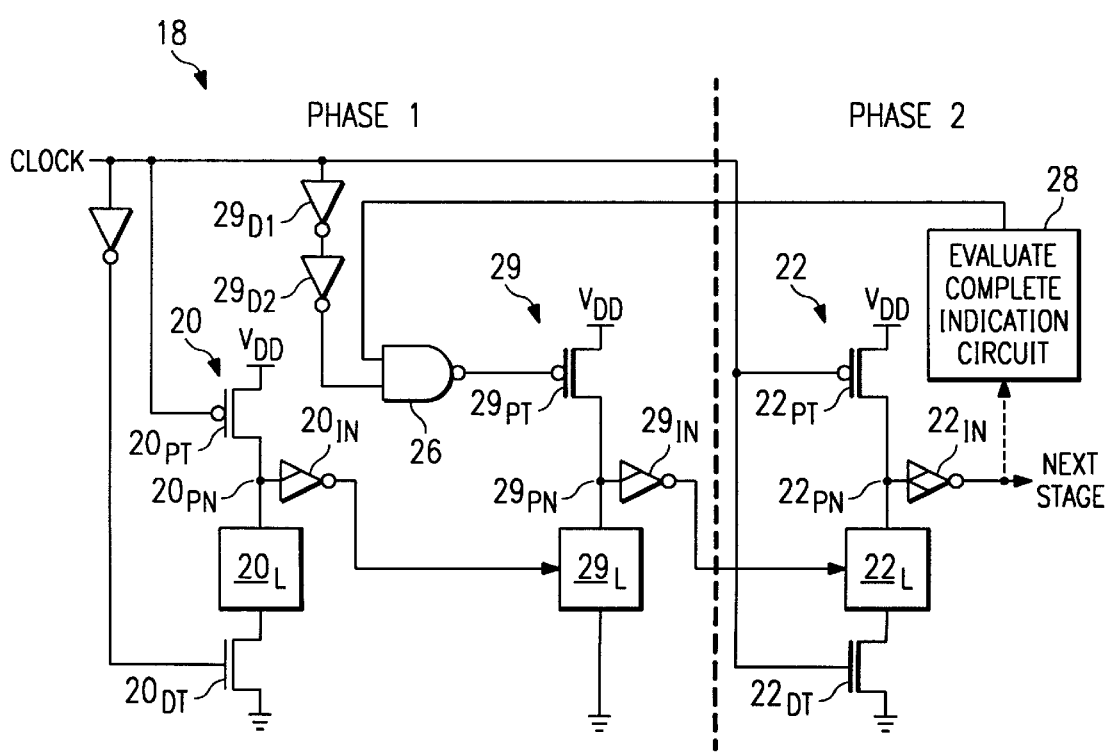
FIG. 2c illustrates a schematic of an alternative inventive embodiment including the domino logic circuits of FIG. 2a, yet with an additional domino logic circuit included within the first phase of the overall circuit system.

FIG. 2*c* illustrates system 18 of FIG. 2*b*, above, but in FIG. 2*c* an additional phase 1 circuit 29 is also included as described below. Particularly, recall that it earlier was stated that the circuits of FIG. 2*a* illustrate only two circuits along a given path, and that the path may include more than two circuits. In this regard, in FIG. 2*c* phase 1 circuit 29 is interposed between phase 1 circuit 20 and phase 2 circuit 22, and this additional domino logic circuit stage also operates according to phase 1 of the CLOCK signal. Like phase 1 circuit 20, phase 1 circuit 29 includes a precharge transistor 29$_{PT}$, a precharge node 29$_{PN}$ connected to the input of an output inverter 29$_{IN}$, and a logic circuit 29$_L$. In contrast, however, note that phase 1 circuit 29 does not include its own discharge transistor. Indeed, in the prior art, as well as in the configuration of FIG. 2*c*, it is quite possible for a path to include multiple successor stages like phase 1 circuit 29, each with or without a discharge transistor. In any event, the last stage within the grouping of phase circuits may operate as a hold time latch to provide an output to the first stage of the next successive phase circuit, and may be configured in accordance with the teachings of this document. Lastly, with respect to the timing of the precharging phase of phase 1 circuit 29, note that it is common for prior art circuits having successive domino logic stages, where those stages do not have respective discharge transistors, to delay the effect of the CLOCK signal transition to the precharge transistor of each of these successor stages, such as by passing the CLOCK signal transition through multiple inverters or the like. In this regard, phase 1 circuit 29 also includes two inverters $29_{D1}$ and $29_{D2}$ coupled to the CLOCK signal conductor; therefore, when the CLOCK signal transitions, there is a two inverter delay before this transition is passed to phase 1 circuit 29.

Turning now to the timing of the precharge phase of operation for phase 1 circuit 29, it is instructive to first evaluate the prior art operation of a comparable circuit which is a successor stage having no discharge transistor and which receives a delayed CLOCK signal transition for precharging. In this respect, note that the prior art stage begins its precharge phase of operation once the delayed CLOCK signal transition reaches the gate of the precharge transistor. However, in contrast to the prior art configuration, note that phase 1 circuit 29 further includes NAND gate 26 connected at one of its inputs to receive the delayed CLOCK signal from inverter $29_{D2}$, and further connected at the other of its inputs to receive the COMPLETE signal from phase 2 circuit 22. Thus, in this alternative embodiment, phase 1 circuit 29 (i.e., the hold time latch of phase 1) again does not precharge until the later one of two events, the first being the assertion of the COMPLETE signal from a successor stage, and the second being responsive to the transition of the CLOCK signal transition from low to high. Once again, therefore, the precharging of the hold time latch is either responsive to the clock signal transitioning from one state to another (following some delay after that transition) or assertion of the COMPLETE signal from the successor stage. In this alternative embodiment, however, note that the COMPLETE signal may reach NAND circuit 26 before the time the delayed transition of the CLOCK signal reaches NAND circuit 26. Still other alternative embodiments will be appreciated by one skilled in the art.

FIG. 3 illustrates a preferred implementation of logic NAND circuit 26 of FIG. 2a, above. Thus, FIG. 3 repeats the illustration of the two inputs signals to logic NAND circuit 26 (i.e., CLOCK and COMPLETE) as well as the output connected to the gate of precharge transistor $20_{PT}$. The input signals are connected to a series connection of transistors as follows. The series transistors of FIG. 3 include a p-channel transistor 30, a first n-channel transistor 32, and a second n-channel transistor 34. P-channel transistor 30 has a source connected to a source of the system voltage level (e.g., $V_{DD}$) and a drain connected to a node 36 which is further connected to the drain of n-channel transistor 32. The source of n-channel transistor 32 is connected to the drain of n-channel transistor 34, and the source of n-channel transistor 34 is connected to ground. The CLOCK signal is connected to the gate of p-channel transistor 30 as well as to the gate of n-channel transistor 34. The COMPLETE signal is connected to the gate of n-channel transistor 32. Lastly, node 36 provides the output of logic NAND circuit 26 and, thus, is connected to the gate of precharge transistor $20_{PT}$.

The operation of logic NAND circuit 26 of FIG. 3 in general provides a NAND operation and, therefore, as known in the art, provides a high output unless both of its inputs are asserted high. For example, if CLOCK is low, and regardless of the value of the COMPLETE signal, p-channel transistor 30 connects node 36 to $V_{DD}$, while n-channel transistor 34 is off which ensures that node 36 is not connected to ground (i.e., prohibits crowbar current). As another example, if COMPLETE is low, and regardless of the value of the CLOCK signal, then n-channel transistor 32 is off which ensures that node 36 is not connected to ground. However, if both CLOCK and COMPLETE are high, then both n-channel transistor 34 and n-channel transistor 32 conduct, while p-channel transistor 30 does not. Consequently, node 36 is pulled to ground through n-channel transistors 32 and 34, thereby providing a low output in response to the two high inputs. Thus, one skilled in the art will appreciate that the embodiment of FIG. 3 provides the required functionality to accomplish the NAND operation set forth in FIG. 2b, above. In addition, such a skilled person may also ascertain other configurations to accomplish this functionality as well.

As a final observation with respect to NAND circuit 26 of FIG. 3, note that it eliminates an additional transistor which is commonly used in the formation of a NAND circuit in the prior art. Specifically, typically a circuit implementing the NAND function would include a p-channel transistor having its source connected to $V_{DD}$, its drain connected to node 30, and its gate connected to receive the COMPLETE signal. In this approach, therefore, it would be necessary that the COMPLETE signal be timed such that, if it became enabling to this additional p-channel transistor before the CLOCK signal became enabling to n-channel transistor 34, then the COMPLETE signal would further be required to remain enabling until the CLOCK signal also became enabling to n-channel transistor 34 (i.e., until the CLOCK signal transitioned from low to high). In other words, as shown in FIG. 3, note that the COMPLETE signal may be asserted and then float before the CLOCK signal transitions from low to high. Thereafter, once the CLOCK signal transitions from low to high, node 36 will discharge and change the output signal of NAND circuit 26. However, if the additional p-channel transistor were included with NAND circuit 26, then an early disabling COMPLTE signal (i.e., one that first transitions to enabling and then is released before the CLOCK signal transitioned from low to high) would cause node 36 to again precharge to $V_{DD}$ and, thus would create an erroneous result when the CLOCK signal thereafter transitioned from low to high.

FIG. 4 illustrates an alternative system embodiment designated generally at 38, and which accomplishes the operation of FIG. 2b such that the COMPLETE signal is directly in response to the output of inverter $22_{IN}$. In other words, in FIG. 4 evaluation complete indication circuit 28 is actually connected to the output of output inverter $22_{IN}$ to detect the triggering of output inverter $22_{IN}$ and provide the COMPLETE signal. Specifically, system 38 uses dual rail circuitry to implement the various circuits and aspects of FIG. 2a. As known in the art, dual rail circuitry may be defined in the context of domino logic circuits, where each stage outputs two "dual rail" signals meaning that both signals are disabling during the precharge phase of operation and then only one of the two signals transitions to enabling after a stage has completed its evaluation during its evaluate phase of operation. Note also that it is stated above that the signal is "disabling", which is a term known in the art, and which indicates that the gate potential is insufficient to cause conduction along the conductive path (i.e., the source/drain) of the transistor to which the gate potential is connected. Thus, for an n-channel transistor, a low signal is disabling, and for a p-channel transistor, a high signal is disabling. In all events, therefore, the characteristic of the dual rails provides the functionality of evaluation complete indication circuit 28 as demonstrated below.

Turning to the circuits of FIG. 4, note that because they represent a dual rail implementation of the embodiment of FIG. 2a, a lengthy discussion is not provided given the assumption that the reader is familiar with the earlier discussion as well as dual rail technology as known in the art. Thus, for each of phase 1 circuit 20 and phase 2 circuit 22 of FIG. 2b, in FIG. 4 those stage are repeated, but each is implemented using a dual rail circuit identified by adding either an "a" or a "b" to the reference numerals so as to distinguish the dual rail elements. For example, with reference to phase 1 circuit 20, it includes two halves designated generally at 20a and 20b. Half 20a includes its own precharge transistor $20a_{PT}$, precharge node $20a_{PN}$, output inverter $20a_{IN}$, and logic circuit $20a_L$. Similarly, half 20b includes its own precharge transistor $20b_{PT}$, precharge node $20b_{PN}$, output inverter $20b_{IN}$, and logic circuit $20b_L$. Both halves 20a and 20b share the same discharge transistor $20_{DT}$. Given this separation of phase 1 circuit 20 into two halves, one skilled in the art will appreciate the similar approach to phase 2 circuit 22.

Again, the notable difference in the dual rail implementation is that the inputs for each stage are dual rail signals. Thus, with respect to phase 1 circuit 20 of FIG. 4, logic circuit $20a_L$ receives an input signal designated as INPUT while logic circuit $20b_L$ receives an input signal designated as $\overline{\text{INPUT}}$, with it understood that these two input signals are dual rail signals (i.e., one will transition to enabling upon completion of evaluation of the preceding stage while the other will remain disabling). Moreover, to maintain the dual rail nature, the dual rail outputs from phase 1 circuits 20a and 20b are connected to logic circuits $22a_L$ and $22b_L$, respectively, of phase 2 circuit 22.

Given the above, note that the dual rail outputs from phase 2 circuit 22 provide a meaningful mechanism which is a direct connection to the output of phase 2 circuit 22 from which to perform the function of the evaluation complete indication circuit 28. More specifically, recall that evaluation complete indication circuit 28 asserts the COMPLETE signal once phase 2 circuit 22 has had sufficient time to complete its evaluation, that is, to trigger its output inverter. In the embodiment of FIG. 4, because it is a dual rail implementation, it is known that the output of either output inverter $22a_{IN}$ or $22b_{IN}$ will be triggered once phase 2 circuit 22 has completed its evaluation. Thus, by performing a logical OR of the outputs of inverter $22a_{IN}$ and $22b_{IN}$, a COMPLETE signal is effectively generated because it is known at that time that phase 2 circuit 22 has evaluated. In the embodiment of FIG. 4, this logical OR operation is combined with the function of logic NAND circuit 26. More specifically, the transistor configuration from FIG. 3 to implement logic NAND circuit 26 is carried forward into FIG. 4, but is further combined with the OR functionality described above. Particularly, in the dual rail implementation of FIG. 4, note that transistor 32 is duplicated into transistor 32a and transistor 32b, where each completes a conductive path from node 36, through transistor 34, to ground, and where each receives one of the dual rail outputs of phase 2 circuit 22. The duplication of transistors 32a and 32b provide the OR function as follows. Assume that CLOCK goes high, thereby causing transistor 34 to conduct. Next, one of the dual rail outputs from phase 2 circuit 22 will rise, thereby representing the COMPLETE signal to enable one of the corresponding transistors 32a or 32b. In response, the enabled one of transistor 32a or 32b will, in combination with transistor 34, pull node 36 to ground, thereby outputting a low signal to each of precharge transistors $20a_{PT}$ and $20b_{PT}$. Consequently, this low signal commences the precharge phase of operation for phase 1 circuit 20.

Figure 5:
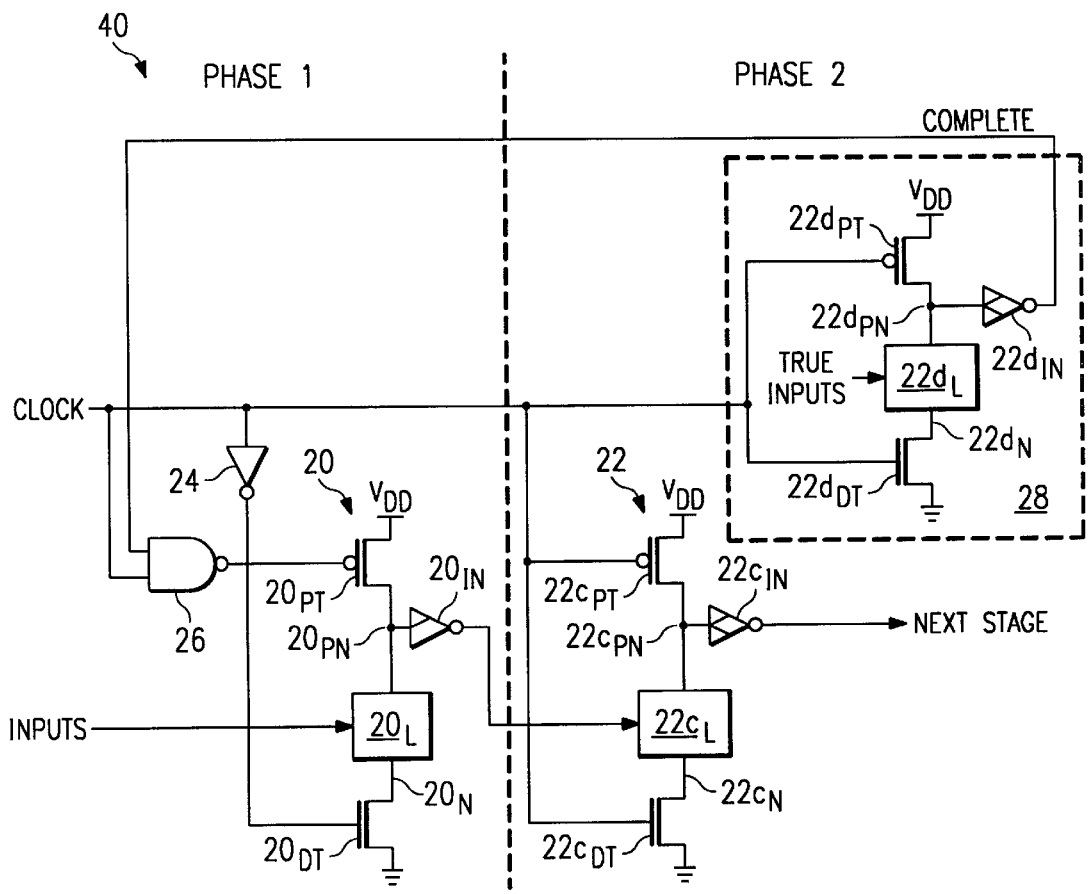
FIG. 5 illustrates a schematic of an alternative inventive embodiment where completion by the successive domino logic circuit of its evaluation is determined by a circuit duplicating the phase 2 circuit but with an output guaranteed to transition during the evaluate phase.

Having presented an example of generating the COMPLETE signal directly from the output of phase 2 circuit 22, recall above that an alternative technique in the present embodiments is to provide the COMPLETE signal as a prediction of when the output of inverter $22_{IN}$ has had sufficient time to be triggered, in which case evaluation complete indication circuit 28 is not connected to the output of output inverter $22_{IN}$. In this regard, FIG. 5 illustrates an alternative system embodiment designated generally at 40 and which shares numerous of the same circuit elements and connections with FIG. 2a. Due to these common features, like reference numerals are carried forward from FIG. 2a to FIG. 5 with respect to such features. Thus, again system 40 includes a phase 1 circuit 20 and a phase 2 circuit 22. Indeed, phase 1 circuit 20 and phase 2 circuit 22 are identical to that shown in FIG. 2a. The difference of system 40, however, is in connection with the association of phase 2 circuit 22 to evaluation complete indication circuit 28, as further detailed below.

Turning to evaluation complete indication circuit 28 of FIG. 5, its components are preferably a duplicate of the components of phase 2 circuit 22. To demonstrate this point, the components of phase 2 circuit 22 and evaluation complete indication circuit 28 share the same reference numerals, but added to those numerals are the letters "c" and "d", respectively, to correlate the components which are duplicates within the respective circuits. Thus, because phase 2 circuit 22 includes a precharge transistor $22c_{PT}$, a logic circuit $22c_L$, a discharge transistor $22c_{DT}$, and an output inverter $22c_{IN}$, then evaluation complete indication circuit 28 includes a respective precharge transistor $22d_{PT}$, a logic circuit $22d_L$, a discharge transistor $22d_{DT}$, and an output inverter $22d_{IN}$. Given the duplicate nature of the components of evaluation complete indication circuit 28 and phase 2 circuit 22, the notable differences relate to the input(s) and output of evaluation complete indication circuit 28. With respect to the input(s) to logic circuit $22d_L$, they are connected in a manner to ensure that logic circuit $22d_L$ will always evaluate its logic equation as true during the evaluate phase, that is, so as to ensure that a discharge path is created through logic circuit $22d_L$. For example, if logic circuit $22d_L$ implements the logic equation of (E AND F AND G), then the three inputs (i.e., E, F, and G) to logic circuit $22d_L$ are connected to input high signals to logic circuit $22d_L$ during the evaluate phase of phase 2 circuit 22. Therefore, each of the three transistors corresponding to the E, F, and G inputs would receive an enabling signal at its gate and, thus, following the time for each transistor to conduct, node $22d_{PN}$ would be discharged through logic circuit $22d_L$ to ground. Lastly, with respect to the output of output inverter $22d_{IN}$, it provides the COMPLETE signal which as discussed above is a representation that phase 2 circuit 22 has had sufficient time to complete its evaluation given the input from phase 1 circuit 20.

Given that the devices in evaluation complete indication circuit 28 and phase 2 circuit 22 are like devices, one skilled in the art will appreciate that the response times for both circuits should be substantially the same. Therefore, evaluation complete indication circuit 28 will model the behavior of phase 2 circuit 22 to thereby provide a prediction of when phase 2 circuit 22 has had sufficient time to trigger its output during a given evaluate phase, even if phase 2 circuit 22 does not so trigger its output for a particular evaluate phase due to its inputs. This action is demonstrated below by way of two examples. First, consider the instance where phase 2 circuit 22 is placed in its evaluate phase and the logic equation of its logic circuit $22c_L$ is true. In this instance, after the delay from the logic implementing transistors of logic circuit $22c_L$, its precharge node $22c_{PN}$ will begin to discharge and eventually will trigger a rising edge output from output inverter $22c_{IN}$. Because the devices of evaluation complete indication circuit 28 have the same delay characteristics, and because the inputs to logic circuit $22d_L$ are guaranteed to be true, then at substantially the same time that the output of output inverter $22c_{IN}$ begins to rise so will the output of output inverter $22d_{IN}$ of evaluation complete indication circuit 28. Thus, the transition from output inverter $22c_{IN}$ represents a model signal (i.e., the COMPLETE signal) with respect to phase 2 circuit 22 because it is asserted at a time when phase 2 circuit 22 has had sufficient time, after commencing its evaluate phase, to trigger the output of its output inverter. Second, consider the instance where phase 2 circuit 22 is placed in its evaluate phase and the logic equation of its logic circuit $22c_L$ is not true. Here, logic circuit $22c_L$ will not conduct and, therefore, the output of output inverter $22c_{IN}$ will not rise. Nevertheless, in this instance the output of output inverter $22d_{IN}$ of evaluation complete indication circuit 28 will again rise after the applicable delays because the inputs to logic circuit $22d_L$ are guaranteed to be true. Thus, the output of output inverter $22d_{IN}$ in this second instance still transitions at a time when its similarly configured phase 2 circuit 22 has had sufficient time to trigger the output of its inverter $22c_{IN}$. Thus, the transition from output inverter $22d_{IN}$ represents a COMPLETE signal with respect to phase 2 circuit 22 because the output of inverter $22d_{IN}$ transitions at a time when the output of inverter $22c_{IN}$ would have transitioned had the inputs to logic circuit $22c_L$ been true.

As a final aspect of evaluation complete indication circuit 28 of FIG. 5, note that, as with earlier logic circuits, logic circuit $22c_L$ may include multiple possible discharge paths based on the logic equation it implements. In this case, note that in the preferred embodiment while all of the transistors of the logic equation from logic circuit $22c_L$ are therefore also included in logic circuit $22d_L$, only those giving rise to the longest delay through logic circuit $22c_L$ are preferably enabled during the evaluate phase in logic circuit $22d_L$ to ensure a discharge path through logic circuit $22d_L$. For example, assume now that logic circuit $22c_L$ implements the logic equation of (H AND J AND K) OR (L AND M). Thus, the longer delay is realized by the first component (i.e., (H AND J AND K)) of this equation because it necessarily includes one more element than does the second component of the equation (i.e., (L AND M)). Consequently, in this example, logic circuit $22d_L$ preferably includes all the same transistors as used to construct logic circuit $22c_L$, yet only inputs H, J, and K are connected to input high signals to logic circuit $22d_L$ during the evaluation phase of phase 2 circuit 22. As a result, if logic circuit $22c_L$ is enabled by the component of (L AND M), then logic circuit $22d_L$ will issue its COMPLETE signal by an additional delay of one transistor because it includes a third enabled transistor to implement the equation of (H AND J AND K). Nevertheless, while this delay will exist, the COMPLETE signal will necessarily occur only after logic circuit $22c_L$ has had a chance to evaluate and, therefore, the functionality provided earlier is ensured by evaluation complete indication circuit 28.

Figure 6:
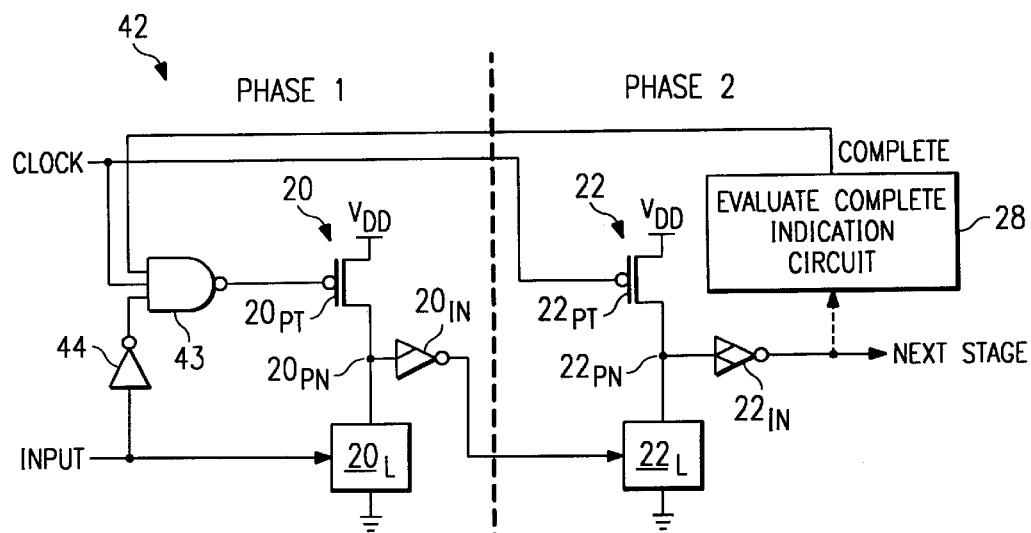
FIG. 6 illustrates a schematic of an alternative inventive embodiment where the precharge phase of operation of the hold time latch is controlled in part in response to the evaluation by the successive domino logic circuit and further in response to the input to the hold time latch transitioning to a level which is non-enabling to its logic circuit.

FIG. 6 illustrates an alternative system embodiment designated generally at 42 and which uses numerous of the same circuit elements and connections of FIG. 2a. Again like reference numerals are carried forward from FIG. 2a to FIG. 6 with respect to common features. Thus, again system 40 includes a phase 1 circuit 20 and a phase 2 circuit 22.

Looking to phase 1 circuit 20, note that precharge node $20_{PN}$ is again connected to a logic circuit $20_L$. However, logic circuit $20_L$ is connected directly to ground and, therefore, phase 1 circuit 20 of FIG. 6 does not include a separate discharge transistor (i.e., one which is analogous to transistor $20_{DT}$ in FIG. 2a). Similarly, looking to phase 2 circuit 22, note that it too has no discharge transistor (as it did in FIG. 2a) and, thus, its precharge node $22_{PN}$ is connected to a logic circuit $22_L$ which is connected directly to ground.

With respect to both phase 1 circuit 20 and phase 2 circuit 22, note that the elimination of a discharge transistor is generally known in the domino logic art, and is implemented where the input(s) to the logic circuit are so-called gated inputs. A gated signal is one that should be disabling to the transistor gate to which it is connected when the circuit is in its precharge phase. For example, a gated input signal could be that which is provided by the output and/or precharge node of another dynamic logic domino gate configuration. As another example, a gated input signal could be that which is provided by the output of a static logic circuit, but which is otherwise controlled (e.g., by a logical AND with another signal) to be disabling during the precharge phase of operation. Thus, if the logic of logic circuit $20_L$ is accomplished using n-channel transistors, then the input(s) to logic circuit $20_L$ are expected to be low during the precharge phase of operation. Given that phase 1 circuit 20 of FIG. 6 has a gated input and no discharge transistor, system 42 is further modified in a manner consistent to implement the functionality of the above embodiments as further demonstrated below.

While permitting the lack of a discharge transistor in combination with a gated input is generally known in the art, the present inventor has further recognized a consideration of that approach in connection with the aspects discussed above. Specifically, the above embodiments adjust the time at which phase 1 circuit 20 begins its precharge phase of operation. Thus, if the precharge phase of operation commences while a gated input is high, there is the possibility that both precharge transistor $20_{PT}$ is conducting at the same time as is logic circuit $20_L$. If this were to occur, then a so-called crowbar current could flow from $V_{DD}$ through these transistors to ground and, as known in the art, such current is undesirable. Given this possibility, system 42 is further enhanced as described below to eliminate the possibility of crowbar currents in this context.

As an enhancement in the context of avoiding crowbar current as introduced above, note that phase 1 logic circuit 20 further includes a three input logic NAND circuit 43 which replaces the two input logic NAND circuit 26 of FIG. 2a. Two of the three inputs of logic NAND circuit 43 are connected to receive the same CLOCK and COMPLETE signals discussed above in connection with FIG. 2a. With respect to the third input of logic NAND circuit 43, note further that phase 1 logic circuit 20 also includes an inverter 44 having its input connected to the same input signal which is input to logic circuit $20_L$, and having its output connected to this third input of logic NAND circuit 43.

Given the above description of FIG. 2b, and combining the additional third input to logic NAND circuit 43 of FIG. 6, one skilled in the art will appreciate that an additional condition is required in the embodiment of FIG. 6 before phase 1 circuit 20 will commence its precharge phase of operation. Specifically, recall from above that the first two inputs to the NAND functionality necessarily limit the precharge operation of phase 1 circuit 20 from commencing until after the later of the transition of the CLOCK from low to high and the successive stage in the next phase circuit having time to complete its evaluation. However, the third input to logic NAND circuit 43 further requires that the input to logic circuit 20$_L$ transitions to disabling before the output of NAND circuit 43 transitions from high to low. Thus, since the input is a gated input signal which may therefore transition to enabling during the evaluate phase of operation, note that system 42 will therefore await the return of that gated input signal to disabling before it permits phase 1 circuit 20 to commence its precharge phase of operation. Note that without this additional condition there would be the possibility of crowbar current if the precharge phase could commence while the gated input is still enabling. However, by adding the additional condition of postponing precharge until after the gated input has become disabling to logic circuit 20$_L$, the possibility of crowbar current in this context is eliminated.

In addition to the above, note that the illustration of system 42 in FIG. 6 is shown to include only a single gated input to logic circuit 20$_L$. However, as with the earlier embodiments, it is possible and actually probable that logic circuit 20$_L$ will receive multiple inputs. If this is the case, then still another inventive embodiment would be to couple each such input through a corresponding inverter and to an additional input of logic NAND circuit 43. Thus, each of these inputs would have to be disabling, along with the rising of CLOCK and the assertion of the COMPLETE signal, before phase 1 circuit 20 were permitted to commence its precharge operation. Note also, however, that in this case of multiple gated inputs, it may be possible based on the particular equation implemented by logic circuit 20$_L$ to connect less than all of the inputs in this fashion. For example, if logic circuit 20$_L$ implemented the equation of (A AND B), and both inputs A and B were gated input signals, then only one of the signals A or B need be connected in the manner described above (i.e., through an inverter to logic NAND circuit 43). For example, assume only signal A were connected through an inverter to logic NAND circuit 43. In this case, even if B were enabling, the above-described connection of A would prevent crowbar current through the transistors which realized that logical equation because the precharge phase would only begin once A were non-enabling, and if A were non-enabling for the equation of (A AND B), then no crowbar current may flow. Clearly, numerous other examples may be derived based on the logic equation at issue, and a person skilled in the art may optimize the number of inputs connected to inverters and logic NAND circuit 43 given these observations as well as the skill in the art.

Lastly, having presented system 42 of FIG. 6 in the context of a hold-time latch, note further that the present inventor has further appreciated its application to a completely different context. Specifically, a type of circuit technology is known in the art as postcharge logic. In postcharge logic, each stage uses discharge transistors and a first stage leaves its output on only for the period of time necessary for a successive stage to evaluate. Thus, unlike the embodiments above, there is no adjustment of the length of the evaluate phase of the first stage if the clock cycle is lengthened. Given, however, that postcharge logic also uses the evaluation of a successive stage as a feedback to control the precharge of a preceding stage, the embodiment of FIG. 6 may also apply to a modification of a postcharge logic circuit, where the discharge transistors are removed from the postcharge logic circuit. Note further that this modification is beneficial in that cycle based simulators often have a problem simulating current postcharge logic circuits because the operation of such circuits are currently based purely on circuit delays, and cycle based simulators typically do not comprehend such delays. The modification of FIG. 6, however, when applied to postcharge logic, imposes clock boundaries and, therefore the simulation problem is removed. Consequently, the simulator may indeed model this modification and, therefore, provides benefits over the prior art.

From the above, it may be appreciated that the above embodiments provide numerous advantages over the prior art. For example, the race condition between a hold time latch and the stage following it is eliminated. Consequently, the chance of data failure resulting from a premature precharge by the hold time latch is eliminated as well. As another example, the present embodiments may be implemented with or without discharge transistors based on the type of input signals at issue. As still another example, certain embodiments may be used to enhance postcharge logic as described above. Moreover, the present embodiments span a wide range of examples, as shown by the various Figures as well as the additional statements setting forth other examples as well. Moreover, a person skilled in the art will appreciate still other alternative implementations of the present embodiments. For example, the conductivity types of various transistors above may be changed and, if such changes are made, the logic NAND function also would be changed to appropriately postpone the precharging of the first domino logic based on the conditions set forth above. An another example, while only two phases are shown in the preceding embodiments, alternative implementations could include multiple phases, whereby each successive phase evaluates out of phase with respect to the preceding phase. Indeed, a person skilled in the art may readily apply the above to still further embodiments not specifically shown above. Consequently, while the present embodiments have been described in detail, various substitutions, modifications or alterations could be made to the descriptions set forth above without departing from the inventive scope which is defined by the claims set forth below.

I claim:

1. A domino logic circuit, comprising:
    a first phase domino logic circuit;
    a second phase domino logic circuit;
    wherein each of the first and second phase domino logic circuits comprises:
        a precharge node;
        a coupling device which when conducting couples the precharge node to a precharge voltage during a precharge phase;
        a discharge path connected to the precharge node which when conducting couples the precharge node to a voltage different than the precharge voltage during an evaluate phase; and
        an inverter coupled to the precharge node and providing an output responsive to a voltage at the precharge node;
    wherein the output of the inverter of the first phase domino logic circuit is connected to control the conduction of the discharge path of the second phase domino logic circuit;
    and further comprising:
        a conductor for providing a clock signal;
        circuitry for commencing the evaluate phase of the first phase domino logic circuit at a first time in response to the clock signal transitioning from a first state to a second state;
        circuitry for commencing the evaluate phase of the second phase domino logic circuit at a second time following the first time; and circuitry for commencing the precharge phase of the first phase domino logic circuit at a third time following the second time;

wherein the third time corresponds to the latest of a plurality of events;

wherein a first of the plurality of events is responsive to the clock signal transitioning from the second state to the first state; and wherein a second of the plurality of events is the discharge path of the second phase domino logic circuit having sufficient time following a beginning of the evaluate phase of the second phase domino logic circuit to conduct to cause the voltage at the precharge node of the second phase domino logic circuit to transition to a level sufficient to trigger the output of the inverter of the second phase domino logic circuit.

2. The domino logic circuit of claim 1 wherein the discharge path of the first phase domino logic circuit comprises a transistor configuration for realizing a logic equation.

3. The domino logic circuit of claim 2 wherein the discharge path of the first phase domino logic circuit further comprises a conductive path along a source/drain from a discharge transistor in addition to the transistor configuration, wherein the discharge transistor conducts at the first time in response to the clock signal transitioning from the first state to the second state.

4. The domino logic circuit of claim 1 wherein the discharge path of the second phase domino logic circuit comprises a transistor configuration for realizing a logic equation.

5. The domino logic circuit of claim 4 wherein the discharge path of the second phase domino logic circuit further comprises a conductive path along a source/drain from a discharge transistor in addition to the transistor configuration, wherein the discharge transistor conducts at the second time in response to the clock signal transitioning from the second state to the first state.

6. The domino logic circuit of claim 1:

wherein the discharge path of the first phase domino logic circuit comprises a transistor configuration for realizing a logic equation; and wherein the discharge path of the second phase domino logic circuit comprises a transistor configuration for realizing a logic equation.

7. The domino logic circuit of claim 1:

wherein the discharge path of the second phase domino logic circuit comprises a transistor configuration for realizing a logic equation;

wherein the circuitry for commencing the precharge phase of the first phase domino logic circuit at a third time comprises circuitry for detecting the second of the plurality of events; the circuitry for detecting the second of the plurality of events comprising a duplicate circuit of the second phase domino logic circuit and having a discharge path;

wherein the discharge path of the duplicate circuit comprises a duplicate transistor configuration of the transistor configuration for realizing a logic equation;

wherein at least one input is connected to the duplicate transistor configuration such that the logic equation realized by the duplicate transistor configuration is true; and wherein the second of the plurality of events occurs in response to a transition at the output of the inverter of the duplicate circuit.

8. The domino logic circuit of claim 1:

wherein the inverter of the second phase domino logic circuit comprises a first inverter and the output of the second phase domino logic circuit comprises a first output;

wherein the second phase domino logic circuit further comprises a second inverter and a second output which is a dual rail signal of the first output; and wherein the second of the plurality of events occurs in response to a transition one of the first output or the second output.

9. The domino logic circuit of claim 1:

wherein the discharge path of the first phase domino logic circuit comprises a transistor configuration for realizing a logic equation in response to at least a first input;

wherein the transistor configuration conducts in part in response to the at least first input being in an enabling state; and wherein a third of the plurality of events is the at least first input being in a disabling state.

10. The domino logic circuit of claim 9 wherein conduction of the discharge path of the first phase domino logic circuit is not responsive to the clock signal.

11. The domino logic circuit of claim 1 wherein the coupling device comprises a p-channel transistor.

12. The domino logic circuit of claim 1 wherein the discharge path comprises a conductive path along a source/drain from of a transistor such that the discharge path is conducting when the transistor is conducting.

13. The domino logic circuit of claim 1 wherein the discharge path comprises a conductive path along a source/drain from each of a plurality of transistors such that the discharge path is conducting when each of the plurality of transistors is conducting.

14. The domino logic circuit of claim 1 wherein the discharge path in the first phase domino logic circuit comprises a first discharge path of a plurality of discharge paths in the first phase domino logic circuit, wherein each of the plurality of discharge paths in the first phase domino logic circuit is connected to the precharge node of the first phase domino logic circuit, and wherein each of the plurality of discharge paths when conducting couples the precharge node to a voltage different than the precharge voltage during an evaluate phase.

15. The domino logic circuit of claim 1:

wherein the circuitry for commencing the precharge phase of the first phase domino logic circuit at a third time comprises a logic operation circuit;

wherein the logic operation circuit has a first input connected to the conductor for providing the clock signal;

wherein the logic operation circuit has a second input connected to receive a complete signal representative of the discharge path of the second phase domino logic circuit having sufficient time following a beginning of the evaluate phase of the second phase domino logic circuit to conduct to cause the voltage at the precharge node of the second phase domino logic circuit to transition to a level sufficient to trigger the output of the inverter of the second phase domino logic circuit; and wherein the logic operation circuit has an output for providing an enabling signal to the coupling device of the first phase domino logic circuit in response to assertion of the later of the signals at the first and second inputs.

16. The domino logic circuit of claim 1:
wherein the circuitry for commencing the precharge phase of the first phase domino logic circuit at a third time comprises a logic operation circuit;
wherein the conductor for providing the clock signal is connected to a delay circuit and for outputting a delayed clock signal responsive to the clock signal;
wherein the logic operation circuit has a first input connected to receive the delayed clock signal;
wherein the logic operation circuit has a second input connected to receive a complete signal representative of the discharge path of the second phase domino logic circuit having sufficient time following a beginning of the evaluate phase of the second domino logic circuit to conduct to cause the voltage at the precharge node of the second phase domino logic circuit to transition to a level sufficient to trigger the output of the inverter of the second phase domino logic circuit; and
wherein the logic operation circuit has an output for providing an enabling signal to the coupling device of the first phase domino logic circuit in response to assertion of the later of the signals at the first and second inputs.

17. The domino logic circuit of claim 1 wherein the circuitry for commencing the precharge phase of the first phase domino logic circuit at a third time comprises a logic operation circuit, consisting of:
a first n-channel transistor having a source connected to a low voltage reference, a gate coupled to receive the clock signal, and a drain coupled to a first node;
a second n-channel transistor having a source connected to the first node, a drain connected to a second node, and a gate connected to receive a complete signal representative of the discharge path of the second phase domino logic circuit having sufficient time following a beginning of the evaluate phase of the second phase domino logic circuit to conduct to cause the voltage at the precharge node of the second phase domino logic circuit to transition to a level sufficient to trigger the output of the inverter of the second phase domino logic circuit; and
a p-channel channel transistor having a source connected to a high voltage reference, a drain connected to the second node, and a gate coupled to receive the clock signal; and
wherein the second node forms the output of the logic operation circuit.

18. A method of operating a domino logic circuit, comprising the steps of:
first, inputting at least a first input signal to a first phase domino logic circuit having a discharge path comprising a logic circuit for receiving the at least a first input signal;
second, responsive to a clock signal transitioning from a first state to a second state, commencing an evaluate phase of the first phase domino logic circuit at a first time such that the logic operation circuit responds to the at least a first input signal, wherein a value is output during the evaluate phase from the first phase domino logic circuit to a second phase domino logic circuit having a discharge path comprising a logic circuit for receiving the value output from the first phase domino logic circuit;
third, commencing an evaluate phase the second phase domino logic circuit at a second time such that the logic circuit of the second phase domino logic circuit responds to the value output from the first phase domino logic circuit, wherein the evaluate phase of the second phase domino logic circuit outputs a value from the second phase domino logic circuit; and
fourth, responsive to the later of a plurality of events, placing the first phase domino logic circuit in a precharge phase at a third time such that a precharge node of the first phase domino logic circuit is pulled to a precharge voltage, thereby overwriting the value from the first phase domino logic circuit;
wherein a first of the plurality of events is responsive to the clock signal transitioning from the second state to the first state; and
wherein a second of the plurality of events is the discharge path of the second phase domino logic circuit having sufficient time to output the value from the second phase domino logic circuit.

19. The method of claim 18 wherein the discharge path of the first phase domino logic circuit comprises a transistor configuration for realizing a logic equation.

20. The method of claim 18 wherein the discharge path of the first phase domino logic circuit further comprises a conductive path along a source/drain from a discharge transistor in addition to the transistor configuration, wherein the discharge transistor conducts at the first time in response to the clock signal transitioning from the first state to the second state.

21. The method of claim 18 wherein the discharge path of the second phase domino logic circuit comprises a transistor configuration for realizing a logic equation.

22. The method of claim 21 wherein the discharge path of the second phase domino logic circuit further comprises a conductive path along a source/drain from a discharge transistor in addition to the transistor configuration, wherein the discharge transistor conducts at the second time in response to the clock signal transitioning from the second state to the first state.

23. The method of claim 18:
wherein the discharge path of the first phase domino logic circuit comprises a transistor configuration for realizing a logic equation; and
wherein the discharge path of the second phase domino logic circuit comprises a transistor configuration for realizing a logic equation.

24. The method of claim 18:
wherein the discharge path of the second phase domino logic circuit comprises a transistor configuration for realizing a logic equation;
wherein the step of placing the first phase domino logic circuit in a precharge phase at a third time comprises detecting the second of the plurality of events by operating a duplicate circuit of the second phase domino logic circuit;
wherein the discharge path of the duplicate circuit comprises a duplicate transistor configuration of the transistor configuration for realizing a logic equation;
wherein at least one input is connected to the duplicate transistor configuration such that the logic equation is true; and
wherein the second of the plurality of events occurs in response to a transition at the output of the inverter of the duplicate circuit.

25. The method of claim 18:
wherein the discharge path of the second phase domino logic circuit comprises a first discharge path;

wherein the logic circuit of the second phase domino logic circuit comprises a first logic circuit;

wherein the first logic circuit has a first inverter coupled to the output of the first logic circuit and for providing a first output; and wherein the second phase domino logic circuit further comprises a second discharge path having a second logic circuit and having a second inverter coupled to the output of the second logic circuit, wherein the output of the second inverter is a second output which is a dual rail signal of the first output; and wherein the second of the plurality of events occurs in response to a transition one of the first output or the second output.

26. The method of claim 18:

wherein the discharge path of the first phase domino logic circuit comprises a transistor configuration for realizing a logic equation in response to the at least a first input signal;

wherein the transistor configuration conducts in part in response to the at least a first input being in an enabling state; and wherein a third of the plurality of events is the at least a first input being in a disabling state.

27. The method of claim 25 wherein conduction of the discharge path of the first phase domino logic circuit is not responsive to the clock signal.

28. The method of claim 18:

wherein the step of commencing the precharge phase of the first phase domino logic circuit at a third time comprises operating a logic operation circuit;

wherein the logic operation circuit has a first input connected to receive the clock signal;

wherein the logic operation circuit has a second input connected to receive a complete signal representative of the discharge path of the second phase domino logic circuit having sufficient time following a beginning of the evaluate phase of the second domino logic circuit to conduct to cause the voltage at the precharge node of the second phase domino logic circuit to transition to a level sufficient to trigger the output of the inverter of the second phase domino logic circuit; and wherein the logic operation circuit has an output for providing an enabling signal to a coupling device of the first phase domino logic circuit in response to assertion of the later of the signals at the first and second inputs, wherein enablement of the coupling device places the first phase domino logic circuit in the precharge phase.

29. The logic circuit of claim 18:

wherein the step of commencing the precharge phase of the first phase domino logic circuit at a third time comprises operating a logic operation circuit;

wherein the logic operation circuit has a first input connected to receive a delayed clock signal from a delay circuit which outputs the delayed clock signal responsive to the clock signal;

wherein the logic operation circuit has a second input connected to receive a complete signal representative of the discharge path of the second phase domino logic circuit having sufficient time following a beginning of the evaluate phase of the second domino logic circuit to conduct to cause the voltage at the precharge node of the second phase domino logic circuit to transition to a level sufficient to trigger the output of the inverter of the second phase domino logic circuit; and wherein the logic operation circuit has an output for providing an enabling signal to the coupling device of the first phase domino logic circuit in response to assertion of the later of the signals at the first and second inputs, wherein enablement of the coupling device places the first phase domino logic circuit in the precharge phase.

* * * * *